United States Patent [19]

Ostapko

[11] Patent Number: 4,559,611
[45] Date of Patent: Dec. 17, 1985

[54] MAPPING AND MEMORY HARDWARE FOR WRITING HORIZONTAL AND VERTICAL LINES

[75] Inventor: Daniel L. Ostapko, Yorktown Heights, N.Y.

[73] Assignee: International Business Machines Corporation, Armonk, N.Y.

[21] Appl. No.: 509,697

[22] Filed: Jun. 30, 1983

[51] Int. Cl.[4] .............................................. G06F 13/00
[52] U.S. Cl. .................................. 364/900; 340/726; 340/727; 340/750
[58] Field of Search ... 364/200 MS File, 900 MS File, 364/521; 365/189; 340/724, 726, 727, 750

[56] References Cited

U.S. PATENT DOCUMENTS

| | | | |
|---|---|---|---|
| 3,292,151 | 12/1966 | Barnes et al. | 340/172.5 |
| 3,466,611 | 9/1969 | Weinberger | 340/172.5 |
| 3,588,829 | 6/1971 | Granito | 340/172.5 |
| 3,737,866 | 6/1973 | Gruner | 340/172.5 |
| 4,020,470 | 5/1977 | Drimak et al. | 340/172.5 |
| 4,024,508 | 5/1977 | Bachman et al. | 340/172.5 |
| 4,025,901 | 5/1977 | Bachman et al. | 340/172.5 |
| 4,126,897 | 11/1978 | Capowski et al. | 364/200 |
| 4,128,873 | 12/1978 | Lamiaux | 364/200 |
| 4,195,342 | 3/1980 | Joyce et al. | 364/200 |
| 4,296,467 | 10/1981 | Nibby, Jr. et al. | 364/200 |
| 4,309,755 | 1/1982 | Lanty | 364/200 |
| 4,402,043 | 8/1983 | Guttag et al. | 364/200 |

Primary Examiner—Raulfe B. Zache
Attorney, Agent, or Firm—John J. Goodwin

[57] ABSTRACT

Structure for enhancing data processing applications by the ability to write both horizontal and vertical lines into a two-dimensional array. The disclosure describes a mapping for storing an array in 64K memory chips, and the required data transformations, address calculations, and chip hardware. As described, the mapping and hardware provide bit addressability in both horizontal and vertical directions.

5 Claims, 12 Drawing Figures

FIG. 1

| a | b | c | d | e | f | g | h | i | j | k | l | m | n | o | p | · | · | · | · |
|---|---|---|---|---|---|---|---|---|---|---|---|---|---|---|---|---|---|---|---|
| α | β | γ | δ | ε | ζ | η | θ | ι | κ | λ | μ | ν | ξ | ο | π | · | · | · | · |
| A | B | C | D | E | F | G | H | I | J | K | L | M | N | O | P | · | · | · | · |
| 1 | 2 | 3 | 4 | 5 | 6 | 7 | 8 | 9 | 10 | 11 | 12 | 13 | 14 | 15 | 16 | · | · | · | · |
| ⓐ | b | c | d | e | f | g | h | i | j | k | l | m | n | o | p | · | · | · | · |
| ⓐ | β | γ | δ | ε | ζ | η | θ | ι | κ | λ | μ | ν | ξ | ο | π | · | · | · | · |
| Ⓐ | B | C | D | E | F | G | H | I | J | K | L | M | N | O | P | · | · | · | · |
| ① | 2 | 3 | 4 | 5 | 6 | 7 | 8 | 9 | 10 | 11 | 12 | 13 | 14 | 15 | 16 | · | · | · | · |
| [a] | b | c | d | e | f | g | h | i | j | k | l | m | n | o | p | · | · | · | · |
| [α] | β | γ | δ | ε | ζ | η | θ | ι | κ | λ | μ | ν | ξ | ο | π | · | · | · | · |
| [A] | B | C | D | E | F | G | H | I | J | K | L | M | N | O | P | · | · | · | · |
| [1] | 2 | 3 | 4 | 5 | 6 | 7 | 8 | 9 | 10 | 11 | 12 | 13 | 14 | 15 | 16 | · | · | · | · |
| △a | b | c | d | e | f | g | h | i | j | k | l | m | n | o | p | · | · | · | · |
| △α | β | γ | δ | ε | ζ | η | θ | ι | κ | λ | μ | ν | ξ | ο | π | · | · | · | · |
| △A | B | C | D | E | F | G | H | I | J | K | L | M | N | O | P | · | · | · | · |
| △1 | 2 | 3 | 4 | 5 | 6 | 7 | 8 | 9 | 10 | 11 | 12 | 13 | 14 | 15 | 16 | · | · | · | · |
| · | · | · | · | · | · | · | · | · | · | · | · | · | · | · | · | · | · | · | · |
| · | · | · | · | · | · | · | · | · | · | · | · | · | · | · | · | · | · | · | · |
| · | · | · | · | · | · | · | · | · | · | · | · | · | · | · | · | · | · | · | · |
| · | · | · | · | · | · | · | · | · | · | · | · | · | · | · | · | · | · | · | · |

| | | | | | | | | | | | | | | | | | | | | | | | |
|---|---|---|---|---|---|---|---|---|---|---|---|---|---|---|---|---|---|---|---|---|---|---|---|
| a | b | c | d | e | p | q | r | s | t | u | v | w | x | y | z | a' | b' | c' | d' | e' | f' | · | · |
| α | β | γ | δ | ε | π | ρ | σ | τ | υ | φ | χ | ψ | ω | α' | β' | γ' | δ' | ε' | ζ' | η' | θ' | · | · |
| A | B | C | D | E | P | Q | R | S | T | U | V | W | X | Y | Z | A' | B' | C' | D' | E' | F' | · | · |
| 1 | 2 | 3 | 4 | 5 | 16 | 17 | 18 | 19 | 20 | 21 | 22 | 23 | 24 | 25 | 26 | 27 | 28 | 29 | 30 | 31 | 32 | · | · |
| ⓐ | b | c | d | e | p | q | · | · | · | · | · | · | · | · | · | · | · | · | · | · | · | · | · |
| ⓐ | β | γ | δ | ε | π | ρ | · | · | · | · | · | · | · | · | · | · | · | · | · | · | · | · | · |
| Ⓐ | B | C | D | E | P | Q | · | · | · | · | · | · | · | · | · | · | · | · | · | · | · | · | · |
| ① | 2 | 3 | 4 | 5 | 16 | 17 | · | · | · | · | · | · | · | · | · | · | · | · | · | · | · | · | · |
| [a] | b | c | d | e | p | q | · | · | · | · | · | · | · | · | · | · | · | · | · | · | · | · | · |
| [α] | β | γ | δ | ε | π | ρ | · | · | · | · | · | · | · | · | · | · | · | · | · | · | · | · | · |
| [A] | B | C | D | E | P | Q | · | · | · | · | · | · | · | · | · | · | · | · | · | · | · | · | · |
| [1] | 2 | 3 | 4 | 5 | 16 | 17 | · | · | · | · | · | · | · | · | · | · | · | · | · | · | · | · | · |
| △a | b | c | d | e | p | q | · | · | · | · | · | · | · | · | · | · | · | · | · | · | · | · | · |
| △α | β | γ | δ | ε | π | ρ | · | · | · | · | · | · | · | · | · | · | · | · | · | · | · | · | · |
| △A | B | C | D | E | P | Q | · | · | · | · | · | · | · | · | · | · | · | · | · | · | · | · | · |
| △1 | 2 | 3 | 4 | 5 | 16 | 17 | · | · | · | · | · | · | · | · | · | · | · | · | · | · | · | · | · |
| ▷a | b | c | d | e | p | q | · | · | · | · | · | · | · | · | · | · | · | · | · | · | · | · | · |
| ▷α | β | γ | ε | ζ | π | ρ | · | · | · | · | · | · | · | · | · | · | · | · | · | · | · | · | · |
| ▷A | B | C | D | E | P | Q | · | · | · | · | · | · | · | · | · | · | · | · | · | · | · | · | · |
| ▷1 | 2 | 3 | 4 | 5 | 16 | 17 | · | · | · | · | · | · | · | · | · | · | · | · | · | · | · | · | · |
| ▽a | b | c | d | e | p | q | · | · | · | · | · | · | · | · | · | · | · | · | · | · | · | · | · |
| ▽α | β | γ | δ | ε | π | ρ | · | · | · | · | · | · | · | · | · | · | · | · | · | · | · | · | · |
| ▽A | B | C | D | E | P | Q | · | · | · | · | · | · | · | · | · | · | · | · | · | · | · | · | · |
| ▽1 | 2 | 3 | 4 | 5 | 16 | 17 | · | · | · | · | · | · | · | · | · | · | · | · | · | · | · | · | · |
| ◁a | b | c | d | e | p | q | · | · | · | · | · | · | · | · | · | · | · | · | · | · | · | · | · |
| ◁α | β | γ | δ | ε | π | ρ | · | · | · | · | · | · | · | · | · | · | · | · | · | · | · | · | · |
| ◁A | B | C | D | E | P | Q | · | · | · | · | · | · | · | · | · | · | · | · | · | · | · | · | · |
| ◁1 | 2 | 3 | 4 | 5 | 16 | 17 | · | · | · | · | · | · | · | · | · | · | · | · | · | · | · | · | · |
| ◇a | b | c | d | e | p | q | · | · | · | · | · | · | · | · | · | · | · | · | · | · | · | · | · |
| ◇α | β | γ | δ | ε | π | ρ | · | · | · | · | · | · | · | · | · | · | · | · | · | · | · | · | · |
| ◇A | B | C | D | E | P | Q | · | · | · | · | · | · | · | · | · | · | · | · | · | · | · | · | · |
| ◇1 | 2 | 3 | 4 | 5 | 16 | 17 | · | · | · | · | · | · | · | · | · | · | · | · | · | · | · | · | · |
| · | · | · | · | · | · | · | · | · | · | · | · | · | · | · | · | · | · | · | · | · | · | · | · |
| · | · | · | · | · | · | · | · | · | · | · | · | · | · | · | · | · | · | · | · | · | · | · | · |

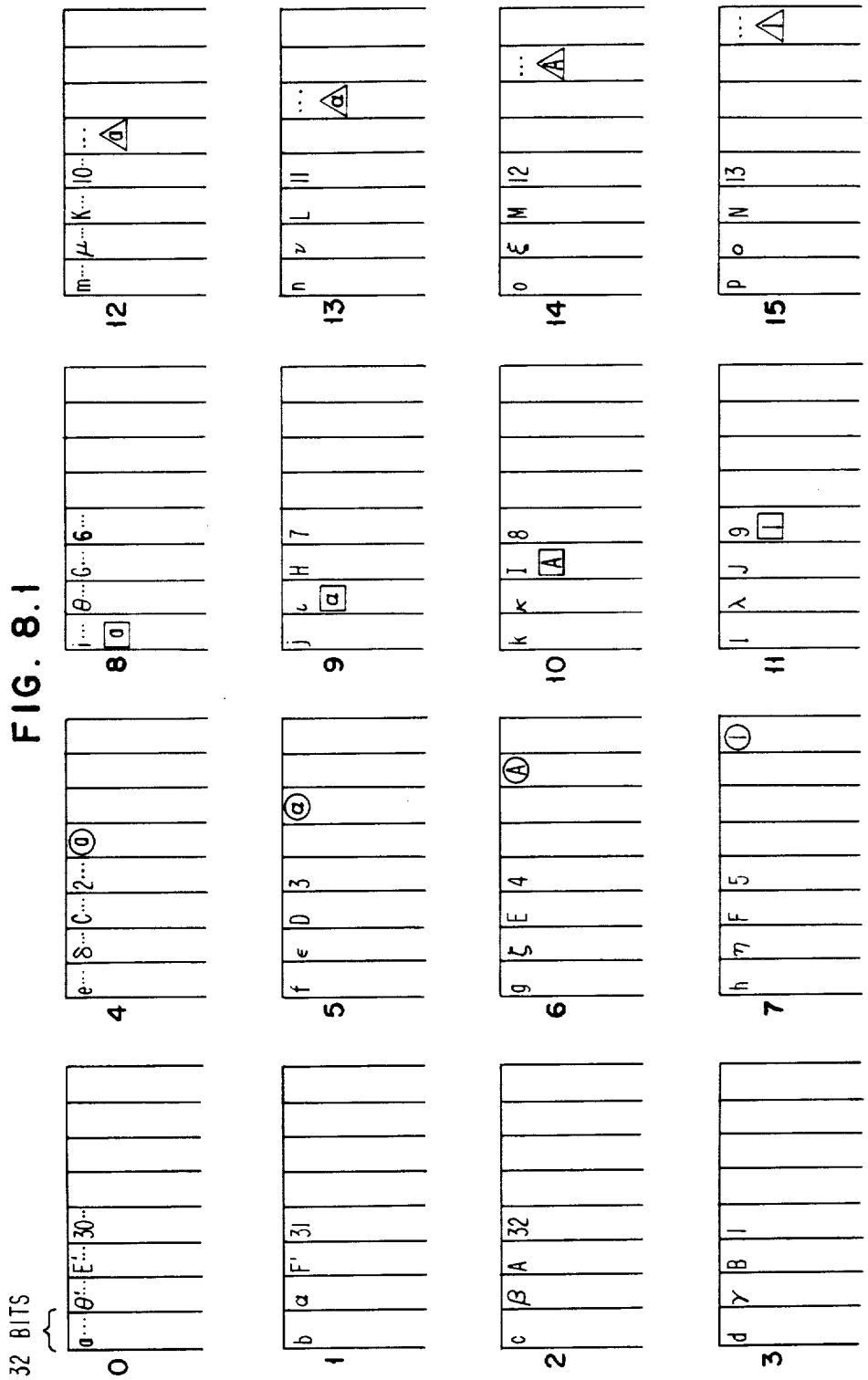
FIG. 8.1

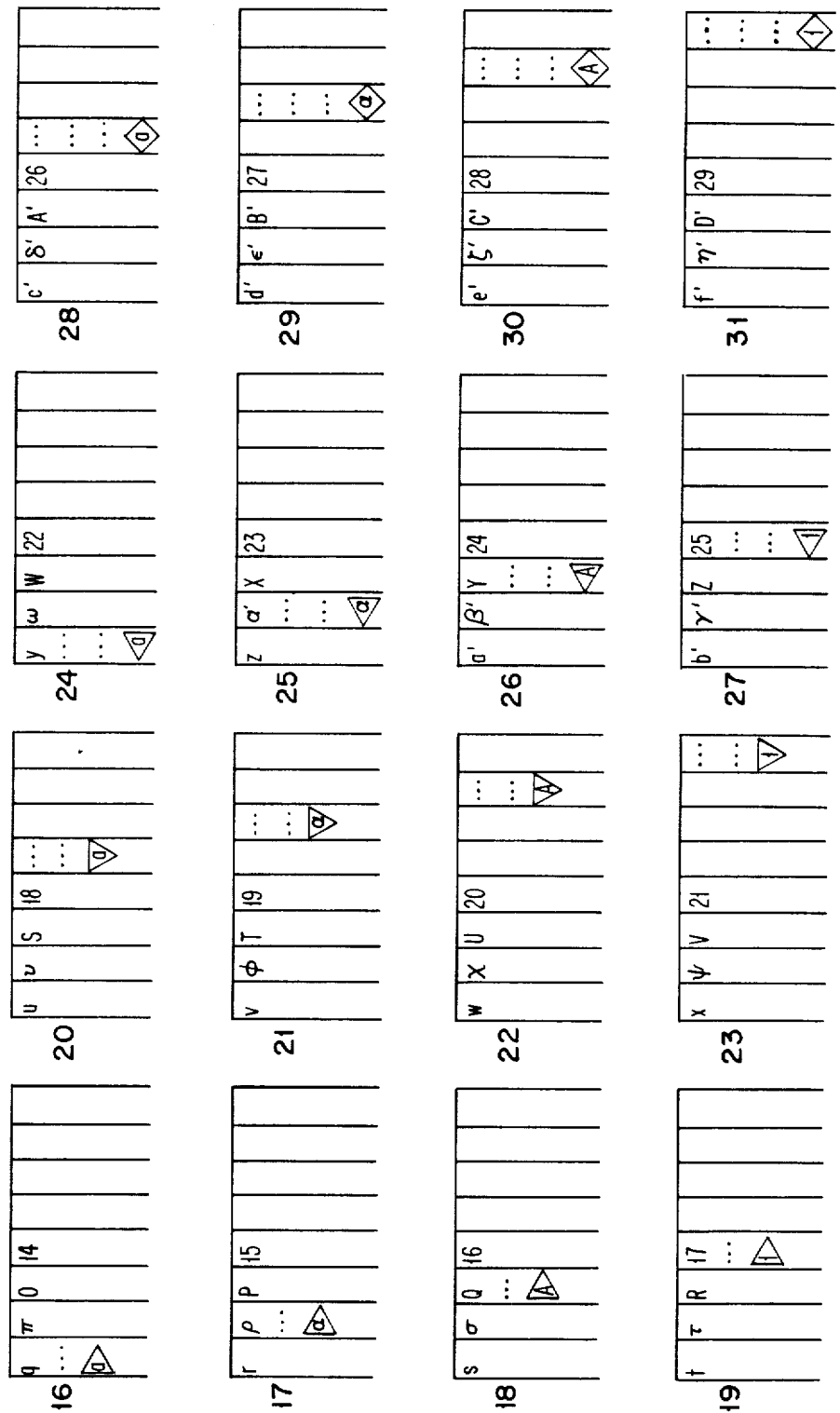
FIG. 8.2

MAPPING AND MEMORY HARDWARE FOR WRITING HORIZONTAL AND VERTICAL LINES

BACKGROUND OF THE INVENTION

1. Field of the Invention

The present invention relates to computing system memories, and more particularly to structure for entering horizontal and vertical information into a two-dimensional memory array which is composed of a collection of memory chips.

2. Description of the Prior Art

A number of references exist in the prior art directed to computer memories and techniques for entering and removing data from such memories. For purposes of background, the following prior art patents are noted.

U.S. Pat. No. 3,466,611 issued Sept. 9, 1969 to A. Weinberger, entitled "Multi-Word Multi-Directional Random Access Memory System" discloses a computer memory configuration wherein multi-word access within the memory is possible in a plurality of directions.

U.S. Pat. No. 4,195,342 issued March 25, 1980 to Joyce et al., entitled "Multi-Configurable Cache Store System" describes a configuration wherein interleaving main memory modules permit the cache memory unit to perform contiguous read requests for adjacent words in main memory without waiting for the first word to be delivered before requesting the second word. This is possible with main memory modules when the adjacent locations reside in separate modules. This is accomplished by having all even addresses reside within one or more memory modules and all odd addresses within an equal number of modules.

U.S. Pat. No. 4,296,467 issued Oct. 20, 1981 to Nibby, Jr. et al. describes a rotating chip selection technique in memory subsystem which includes at least one up to a number of memory module boards identical in layout and construction. The board includes a number of memory chips which are positioned at an initial physical row location providing a predetermined number of addressable contiguous memory locations corresponding to a predetermined increment of memory capacity. The board further includes a register for receiving address signals for accessing the contents of a memory location, rotating chip selection circuits which include a set of switches and an arithmetic unit having first and second sets of input terminals. The first set of input terminals is connected to the register for receiving predetermined ones of the address signals representative of the physical row location of chips being addressed and the second set of input terminals are connected to receive signals from the set of switches. The arithmetic unit operates to perform a predetermined arithmetic operation upon the signals applied to the sets of input terminals to generate a set of logical row address signals for enabling the number of chips at the initial row location.

None of the references shows the mapping technique and hardware of the present invention.

Other references in this technical area are as follows:

| U.S. Pat. No. | |
| --- | --- |
| 3,292,151 | 4,025,901 |
| 3,588,829 | 4,126,897 |
| 3,737,866 | 4,128,873 |
| 4,020,470 | 4,309,755 |

| -continued |
| --- |
| U.S. Pat. No. |
| 4,024,508 |

SUMMARY OF THE INVENTION

An object of the present invention is to provide structures for writing horizontal and vertical bit strings into a two-dimensional computer memory which is composed of a collection of memory chips.

Another object of the present invention is to provide memory structure to provide bit addressability in both horizontal and vertical directions.

Still another object of the present invention is to provide a display system for mapping from a frame buffer to a high function raster-scan display screen with the enhanced structure for writing vertical bit strings at the same speed as horizontal bit strings.

The foregoing and other objects, features and advantages of this invention will be apparent from the following more particular description of the invention as illustrated in the accompanying drawings.

BRIEF DESCRIPTION OF THE DRAWINGS

FIG. 1 symbolically illustrates a two-dimensional array notation of data bits for a 1K × 1K bit array.

FIG. 2 symbolically illustrates the mapping of the data bits of the two-dimensional array of FIG. 1 into a plurality of memory chips.

FIGS. 8.1 and 8.2 symbolically illustrate the data bits of the array of FIG. 5 into a 2K × 1K screen.

DESCRIPTION OF THE PREFERRED EMBODIMENT

Figure 3:
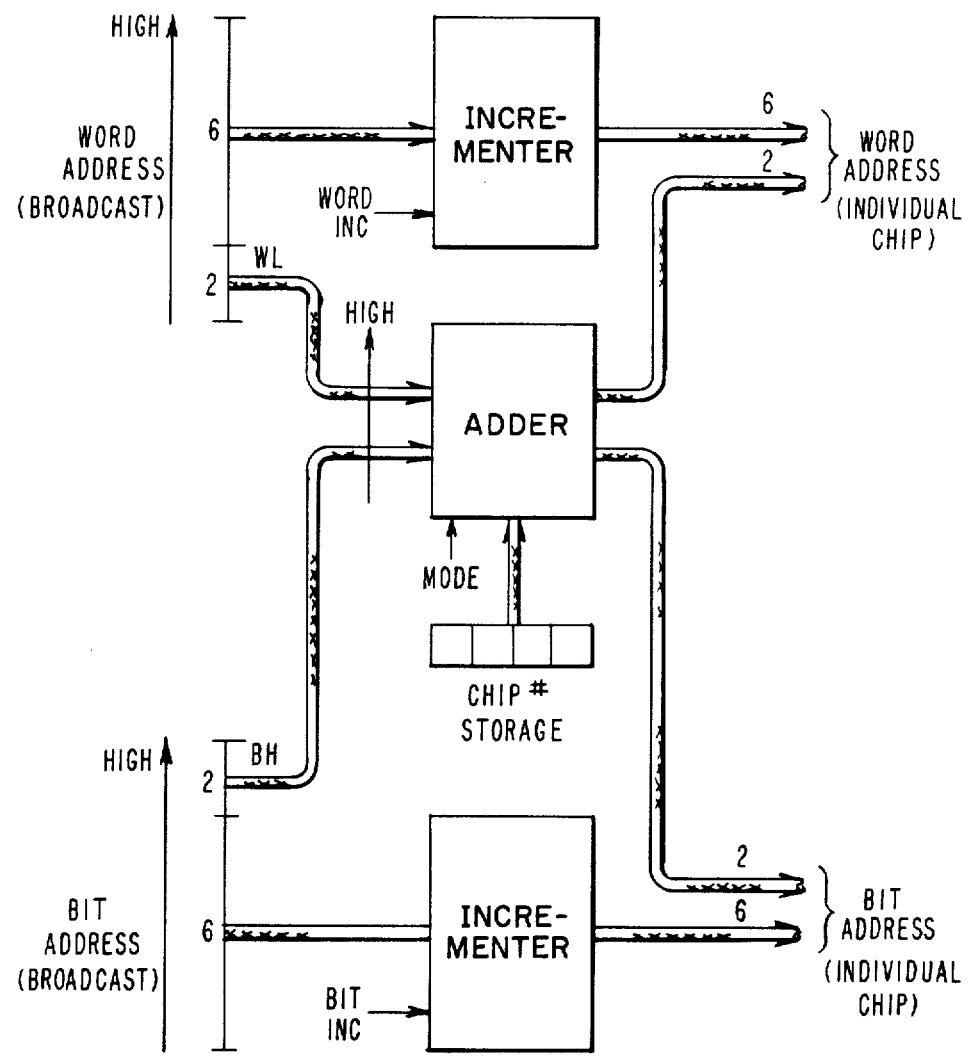
FIG. 3 is a schematic block diagram of an on-chip address translation structure according to the principles of the present invention.

There are many data processing applications that can be enhanced by the ability to write both horizontal and vertical lines into a two-dimensional array according to the present invention. The following describes a mapping for storing an array in 64K memory chips, and the required data transformations, address calculations, and chip hardware. As described, the mapping and hardware provide bit addressability in both horizontal and vertical directions. However, removal of the incrementer associated with the word and/or bit address will remove the bit addressability in the vertical and/or horizontal direction respectively, while still retaining the ability to write 16 bits beginning at even byte boundaries.

Figure 2:
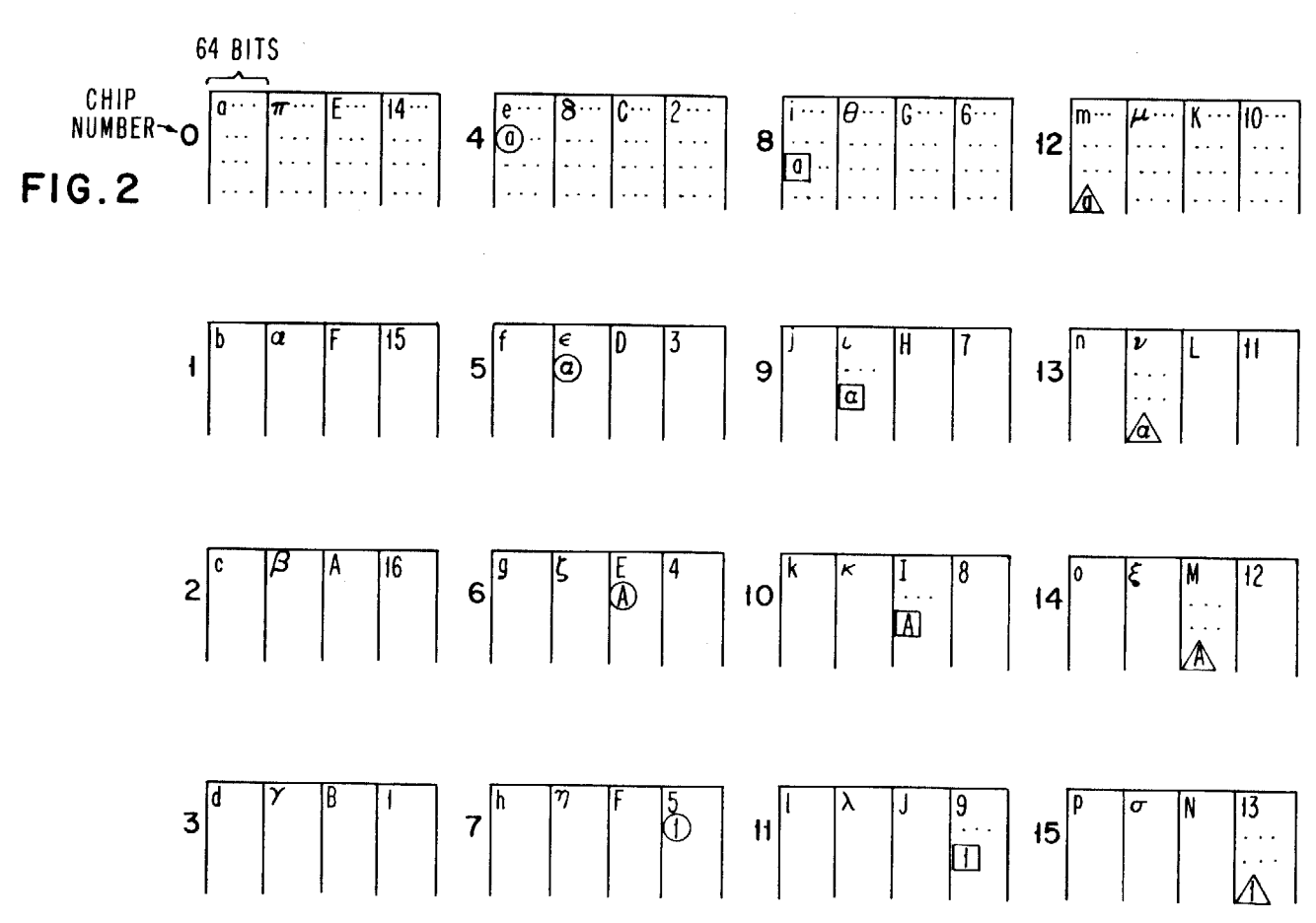

Referring to FIG. 1, a two-dimensional array of data bits is illustrated and FIG. 2 shows the mapping of the array into the memory chips. It is seen that 16 horizontal bits are placed into corresponding locations in each chip with a bit increment for those chips associated with bits crossing an even byte boundary. The mapping of 16 vertical bits is somewhat more complicated, in that the bits are placed in corresponding locations in quadrants of different words. The quadrants increase by 1 modulo 4 and the words increase by 1 each time the quadrant becomes 0. This sequencing through quadrants and words is best described by associating a 4 bit quantity with location where the 2 low order bits define the quadrant and the 2 high order bits define the 2 low order bits of the word address. Sequencing through the locations then corresponds to sequencing through the consecutive numbers 0 to 15. For those bits that cross an even byte boundary, the word address must be increased by four. The important observation to be made about the mapping is that 16 horizontal or vertical bits can be written into memory in one cycle because no two bits are mapped to the same chip.

Given that 16 horizontal or 16 vertical bits can be mapped into the memory in one write cycle, the next important question is the computational complexity and the amount of additional hardware required. This complexity and hardware is required for address calculation and data manipulation, on-chip address translation, and memory to raster-scan conversion.

Address Calculation and Data Manipulation

The functions to be performed by the address generation chip are given by the following equations where X,Y is the screen address; mode and bit and word addresses are broadcast to all chips; and each chip receives the appropriate data, mask and increment signal:

Horizontal Mode:

Bit-address (5,4,3,2,1,0) = integer of X/16 or X(9,8,7,6,5,4)
Bit-address (7,6) = 4 modulo Y or Y(1,0)
Word-address (1,0) = 4 modulo integer of Y/4 or Y(3,2)
Word-address (7,6,5,4,3,2) = integer of Y/16 or Y(9,8,7,6,5,4)
Data = 16 modulo (X+Y) rotate of 16 take Data
Mask = 16 modulo (X+Y) rotate of 16 take #Data 1's
Bit increment = 16 modulo (X+Y) rotate of ((16−16|X) number of zeros followed by (16|X) number of ones.

The "16 take" can be deleted if it is assumed that 16 bits of data are always received. The term "16 take" indicates that the user may want to write less than 16 bits.
Word-increment = 0
Mode = 0
Vertical Mode:

The address of the first bit in the vertical line is the same as that calculated in the horizontal mode. However, this bit is in chip #16 modulo (X+Y). Since the address modification in the chip adds the chip # to the portion of the address WL,BH, that portion of the address must be decreased by 16 modulo (X+Y) before being broadcast to all chips. With this modification the address modification equations become:

| | |
|---|---|
| Bit-address (5,4,3,2,1,0) = | Integer of X/16 or X(9,8,7,6,5,4) |
| Bit-address (7,6) = | 4 moduluo Y-16 modulo (X+Y) |
| | = 4 modulo −X |
| Word-address (1,0) = | 4 modulo ((4×4| integer part of Y/4)− 16|(X+Y))/4 |
| | = 4 modulo (16|Y-16|(X+Y))/4 |
| | = 4 modulo integer of −X/4 |
| Word-address (7,6,5,4,3,2) = | integer of Y/16 or Y(9,8,7,6,5,4) |
| Data = | 16 modulo (X+Y) rotate of 16 take Data |
| Mask = | 16 modulo (X+Y) rotate of 16 take #Data 1's |
| Word-increment = | 16 modulo (X+Y) rotate of ((16−16 |Yρ0), (16|Y)ρ1 |

Note that this is the same function as the bit increment above with the appropriate change of X to Y.
Bit-increment = 0
Mode = 1
On-Chip Address Translation:

FIG. 3 shows the on-chip hardware required for address translation. The translation affects only the two low order bits of the word address and the two high order bits of the bit address. The function performed is an addition of the 4 bit chip number from the chip number storage to the four bits formed by catenating BH and WL where BH is the two low order bits and WL is the two high order bits which are applied as inputs to the adder. The four bit result of the addition (ignoring carry out) is also the catenation of BH and WL in the same order as in the input. The six higher order bits of the word address and the six lower order bits of the bit address are applied to respective incrementer circuits as illustrated. It should be noted that the portion of the word and bit address that may be altered by their respective incrementers are disjoint from the portion that is modified by the 4 bit adder. Therefore, the incrementers can be removed independently from the remainder of the address translation hardware. Thus, a modified scheme can be implemented in which writing starts only on even byte boundaries in either or both horizontal and vertical directions. Further, it should be noted that the incrementer can be shared since at most, one of them is active during a given write operation. The four bits that identify the chip position or number can be either on-chip storage as shown, or signal pins that are connected to the appropriate signals. It should be noted that in mode = 0, the adder receives 0 from chip number storage. The adder and the incrementer circuits used in the structure of FIG. 3 are conventional state-of-the-art devices.

Figure 4:
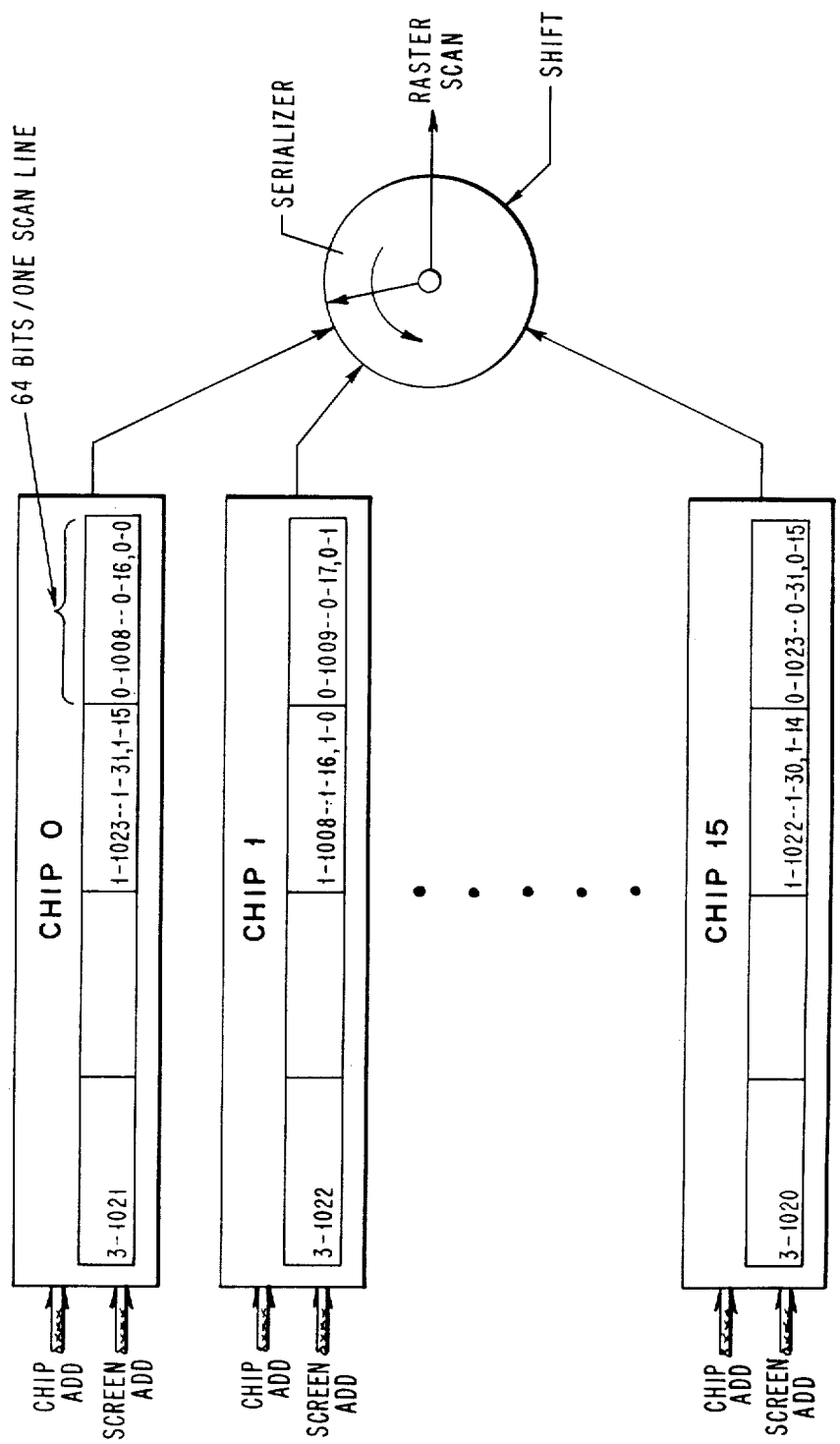
FIG. 4 is a schematic block diagram of a memory to raster conversion scheme for serializing the output stream from a memory according to the principles of the present invention.

Memory to Raster-Scan Conversions:

FIG. 4 shows the scheme necessary for serializing the output bit stream. The only modification to the typical raster generation scheme of the prior art is the addition of hardware that increments the serializer position once after each scan line in order to account for the staggered storage pattern. Each READ into the output buffer provides enough data for four scan lines. These bits are scanned successively in the bit direction with the origin within the 16 buffers being incremented modulo ≠after every scan line.

The screen signals are obtained from row buffer storage devices (i.e., 256 bit row buffer in the specific example of FIG. 4). The 16 chip row buffers will contain the first four scan lines of the 1K×1K display. The scan lines are stored in a manner that provides easy access as indicated by the bit coordinates shown in FIG. 4.

FIGS. 1 through 4 relate to mapping and memory hardware for writing horizontal and vertical lines for a 1K×1K screen. In the present invention, the mapping can be extended to any of four screen sizes obtained by doubling one or both of the dimensions (i.e., 1K×2K, 2K×1K and 2K×2K). This mapping effectively uses the same hardware described in FIGS. 3 and 4 with slight modification.

Figure 5:
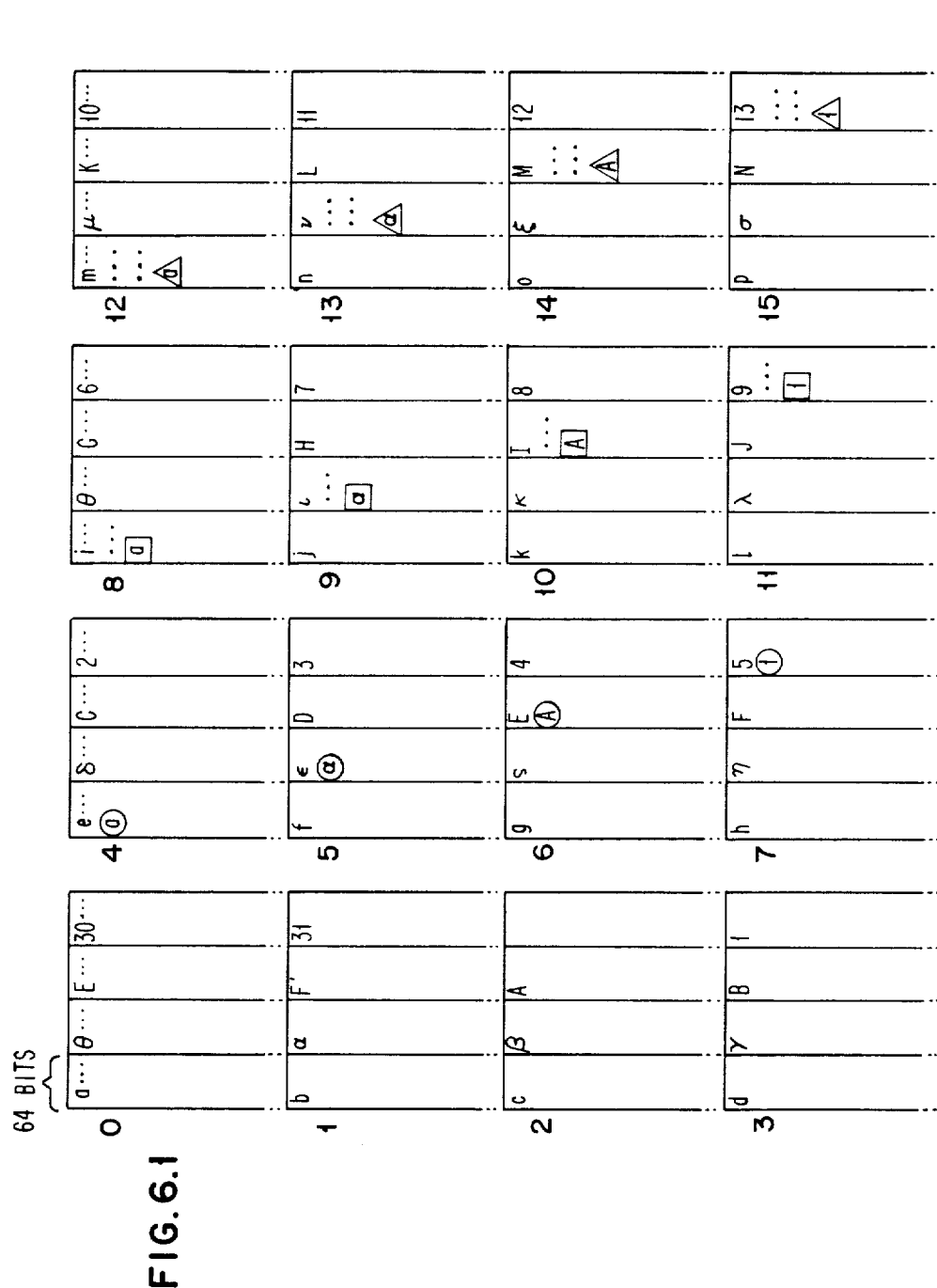
FIG. 5 illustrates a two-dimensional array of data bits notation for 1K × 1K, 1K × 2K, 2K × 1K and 2K × 2K screens.

FIG. 5 shows the notation that describes the pels on the screen. This notation is used to show the placement of the pels in the memory chips for the different mappings.

Figure 6:
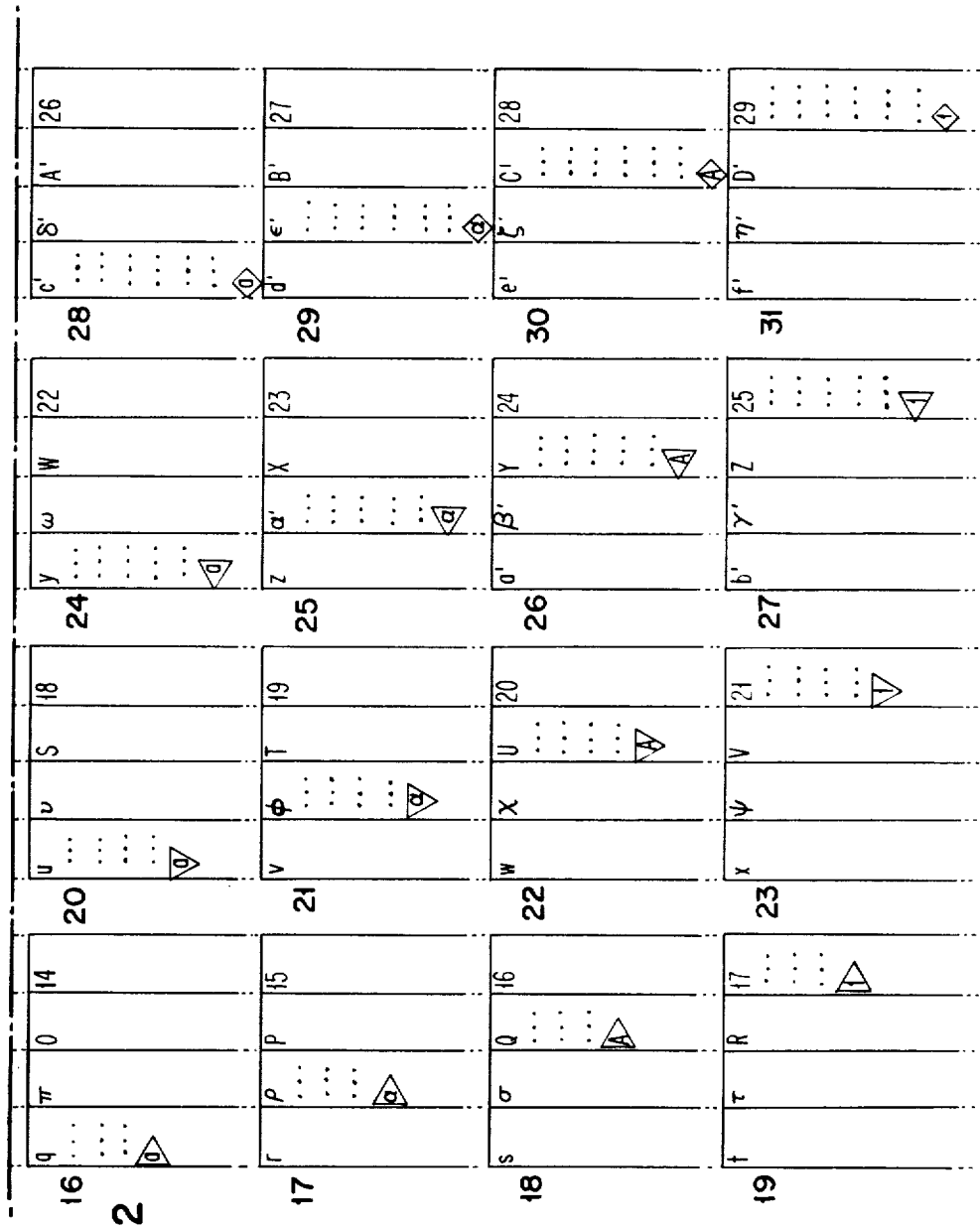
FIGS. 6.1 and 6.2 symbolically illustrate the mapping of the data bits of the array of FIG. 5 into a 1K × 2K screen with 32 chips and a 32 bit data path.

FIG. 6 shows the mapping extended to a 1K×2K screen with 32 chips and a 32 bit data path. It is seen that the mapping is similar to the 1K×1K mapping except that the word modularity is 8 rather than 4. This mapping is almost like the original except that 32 bits are written simultaneously.

Figure 7:
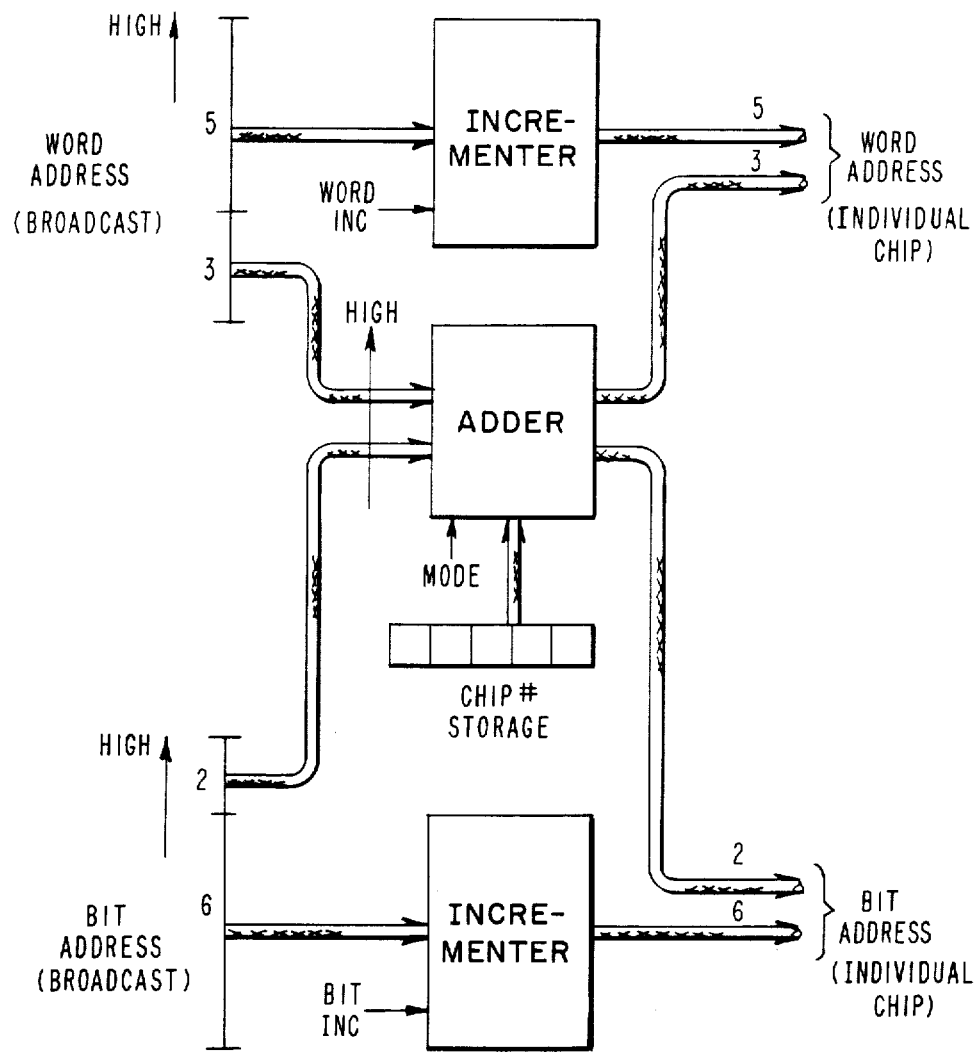
FIG. 7 is a schematic block diagram of the hardware for implementing the mapping of FIG. 6.

FIG. 7 illustrates the hardware for the 1K×2K mapping embodiment. The only modification from the 1K×1K hardware is that the adder is now 5 bits and an extra chip number bit and one additional lower order bit of the word address are passed through it.

FIG. 8 shows the mapping for a 2K×1K screen. Here the modularity in the bit dimension is doubled. It is seen that the adder is 5 bits and an extra chip number bit and one additional bit of the bit address are sent through it.

Figure 9:
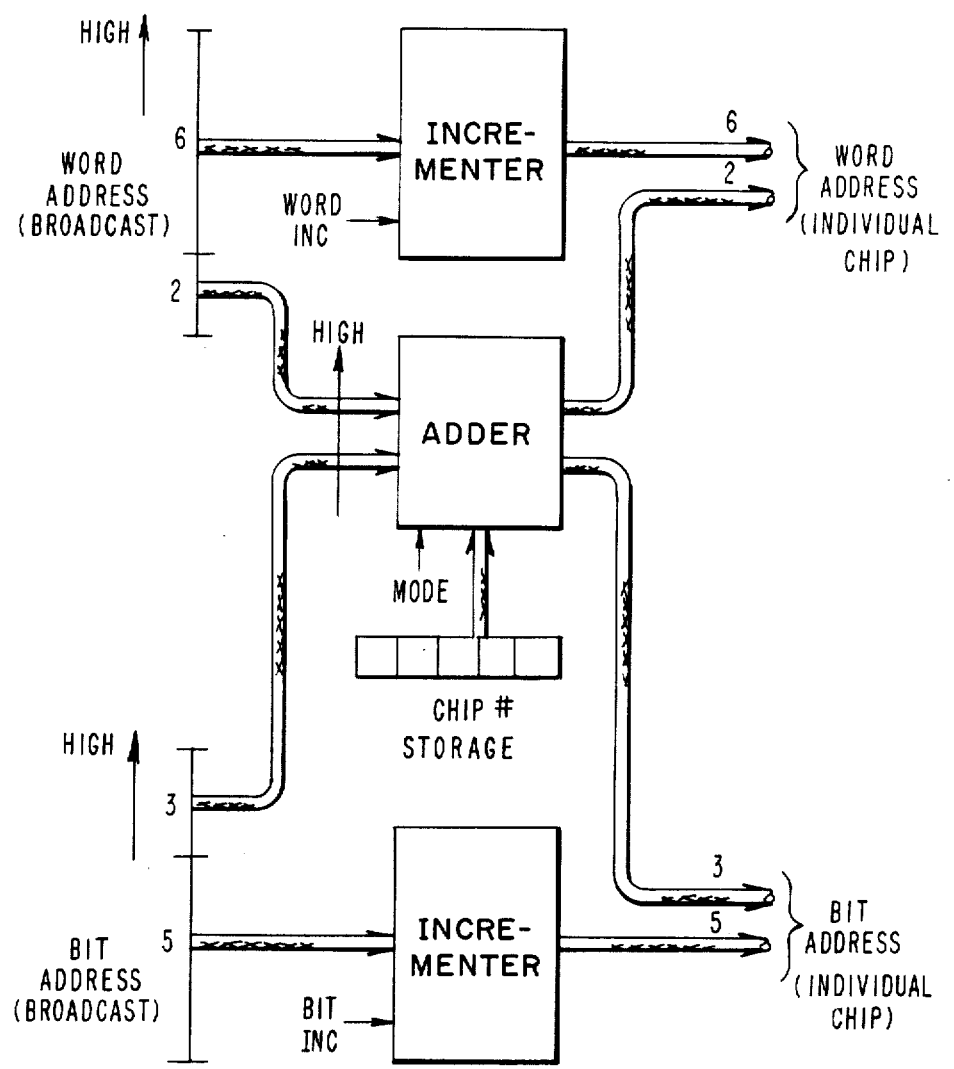
FIG. 9 is a schematic block diagram of the hardware for implementing the mapping of FIG. 8.

FIG. 9 illustrates the hardware for the mapping for a 2K×1K screen. The only modification over the hardware of FIG. 7 is that two lower order word address bits and three higher order bit address bits are applied to the adder, six bits are applied to the word address incrementer and five bits are applied to the bit address incrementer, with corresponding variations in the outputs.

Figure 10:
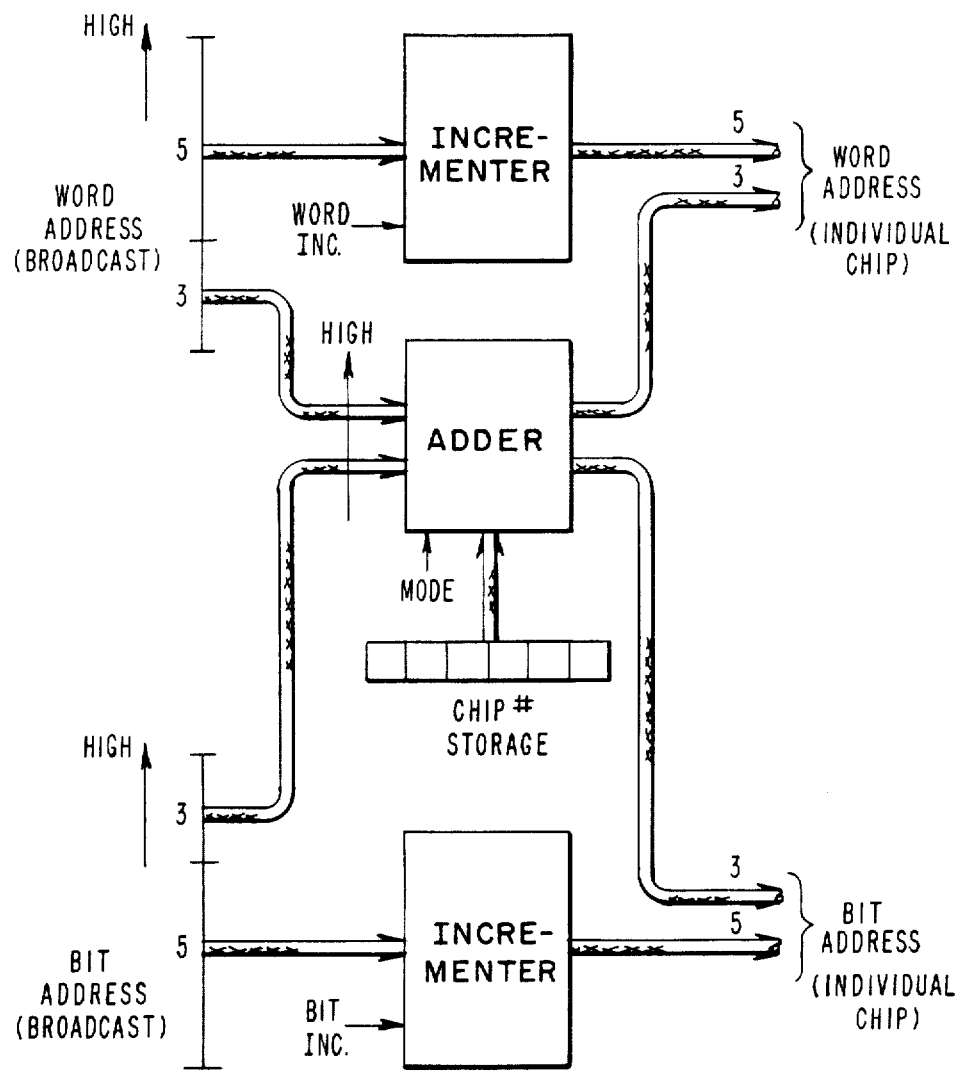
FIG. 10 is a schematic block diagram of the hardware for implementing the mapping of data bits into a 2K × 2K screen.

FIG. 10 illustrates the modification of the hardware for mapping a 2K×2K screen. It is noted that the difference over FIG. 9 is that three lower order bits of the word address are applied to the adder along with the three high order bits of the bit address. Consequently, the chip number storage provides six bits to the adder. It should be noted that in Mode=0, the adder receives 0 from chip number storage.

In another modification of the present invention, the multiplexing of addresses may be employed. In prior art systems it is known that the horizontal word address may be followed by a series of bit addresses. In the present invention, the same technique can be utilized, with the further novel aspect that in addition to the word address being followed by a series of bit addresses for the horizontal case, the bit address can be applied followed by a series of word addresses in the vertical case.

In such an embodiment, the structure of FIGS. 3, 7, 9 and 10 is modified in that only one incrementer means is used with both the "word inc" signal and the "bit inc" signal being applied to the one incrementer in a time shared manner. Thus, in the mode wherein a word address is applied followed by a series of bit addresses, the "word inc" signal is applied first. When a bit address is applied followed by a series of word addresses, the "bit inc" signal is applied first.

What has been described is structure for entering horizontal and vertical bit strings into a two-dimensional computer memory. The invention is useful for use in display systems wherein mapping from a frame buffer to a high function raster-scan display screen is enhanced by the described structure for writing either vertical bit strings or horizontal bit strings.

The invention was described as including a plurality of separate memory chips. One skilled in the art will appreciate that each of the discrete memory locations required may, along with their associated circuits, be fabricated onto a single master chip.

Having thus described my invention, what I claim as new, and desire to secure by Letters Patent is:

1. A system for storing a two-dimensional array of data bits on a plurality of memory chip locations comprising:

means for storing an array of data bits corresponding to horizontal and vertical lines in a plurality of memory chips wherein said data bits for said horizontal lines are stored in said memory chips in a different sequence than said data bits for said vertical lines, and means connected to each of said memory chips for reading out said data bits into a serialized output bit stream for a two-dimensional raster-scan display application.

2. A system according to claim 1 wherein said means for storing said array of data bits includes an address generator means for address translation, said address generator means including at least one incrementer means responsive to first selected bits of a data word address, and responsive to first selected bits of a data bit address, a chip number storage means for providing chip number bits, an adder means responsive to second selected bits of said data word address and said data bit address and to said chip number bits from said chip number storage means to produce an adder output means, wherein said adder output means is combined with the output of said at least one incrementer means to produce a translated data word address and a translated data bit address.

3. A system according to claim 1 wherein said means for storing said array of data bits includes an address generator means for address translation, said address generator means including a first incrementer means responsive to first selected bits of a data word address, and responsive to first selected bits of a data bit address, a chip number storage means for providing chip number bits, an adder means responsive to second selected bits of said data word address and said data bit address and to said chip number bits from said chip number storage means to produce an adder output means, wherein said adder output means is combined with the output of said first incrementer means to produce a translated data word address and is combined with the output of said second incrementer means to produce a translated data bit address.

4. A system according to claim 2 wherein said second selected bits of said data word address are low order bits of said address and said second selected bits of said data bit address are high order bits of said address.

5. A system according to claim 3 wherein said word address consists of eight bits (positions 7,6,5,4,3,2,1,0) and said bit address consists of eight bits (positions 7,6,5,4,3,2,1,0), and wherein said address generator means carries out an address translation function in the horizontal mode specified as Bit-address (5,4,3,2,1,0) = integer of X/16 or X(9,8,7,6,5,4)

Bit-address (7,6) = 4 modulo Y or Y(1,0)

Word-address $(1,0) = 4$ modulo integer of $Y/4$ or $Y(3,2)$

Word-address $(7,6,5,4,3,2) =$ integer of $Y/16$ or $Y(9,8,7,6,5,4)$ and wherein said address generator means carries out an address translation function in the vertical mode specified as Bit-address $(5,4,3,2,1,0) =$ Integer of $X/16$ or $X(9,8,7,6,5,4)$ Bit-address $(7,6) = 4$ modulo $Y$-16 modulo $(X+Y)$
$= 4$ modulo $-X$ Word-address $(1,0) = 4$ modulo $((4\times 4 \mid$ integer part of $Y/4) - 16\mid(X+Y))/4$
$= 4$ modulo $(16\mid Y - 16\mid(X+Y))/4$
$= 4$ modulo integer of $-X/4$ Word-address $(7,6,5,4,3,2) =$ integer of $Y/16$ or $Y(9,8,7,6,5,4,)$.

* * * * *